(12) United States Patent
Leung et al.

(10) Patent No.: US 9,947,632 B2
(45) Date of Patent: Apr. 17, 2018

(54) SEMICONDUCTOR DEVICE AND METHOD OF MAKING A SEMICONDUCTOR DEVICE

(71) Applicant: Nexperia B.V.

(72) Inventors: Chi Ho Leung, Kwun Tong (HK); Pompeo V Umali, Hong Kong (HK); Shun Tik Yeung, Hong Kong (HK); Wai (Kan Wae) Lam, Ta Kwu Ling (HK)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 15/336,774

(22) Filed: Oct. 27, 2016

(65) Prior Publication Data

US 2017/0133335 A1    May 11, 2017

(30) Foreign Application Priority Data

Nov. 11, 2015    (EP) .................................... 15194136

(51) Int. Cl.
*H01L 23/48*    (2006.01)
*H01L 23/52*    (2006.01)
(Continued)

(52) U.S. Cl.
CPC .............. *H01L 24/05* (2013.01); *H01L 21/78* (2013.01); *H01L 23/3121* (2013.01); *H01L 23/3185* (2013.01); *H01L 23/481* (2013.01); *H01L 24/03* (2013.01); *H01L 25/0657* (2013.01); *H01L 21/561* (2013.01); *H01L 23/562* (2013.01); *H01L 2224/036* (2013.01); *H01L 2224/039* (2013.01); *H01L 2224/03011* (2013.01); *H01L 2224/03013* (2013.01);
(Continued)

(58) Field of Classification Search
CPC ........ H01L 23/481; H01L 24/05; H01L 24/06; H01L 24/03
USPC .......................................................... 257/774
See application file for complete search history.

(56) References Cited

U.S. PATENT DOCUMENTS

| | | | |
|---|---|---|---|
| 2009/0170241 A1* | 7/2009 | Shim, II ................ | H01L 21/568 438/107 |
| 2009/0227070 A1 | 9/2009 | Miyajima | |

(Continued)

OTHER PUBLICATIONS

Extended European Search Report for Patent Appln. No. 15194136.6 (May 4, 2016).

*Primary Examiner* — Theresa T Doan
(74) *Attorney, Agent, or Firm* — Ohlandt, Greeley, Ruggiero & Perle, L.L.P.

(57) ABSTRACT

A semiconductor device and a method of making the same. The device includes a semiconductor substrate having a major surface, one or more contacts located on the major surface and an encapsulant covering at least the major surface. A peripheral edge of each contact defines a contact area on the major surface. The device also includes one or more bond pads located outside the encapsulant. Each bond pad is electrically connected to a respective contact located on the major surface of the substrate by a respective metal filled via that passes through the encapsulant. A sidewall of each respective metal filled via, at the point at which it meets the respective contact, falls inside the contact area defined by the respective contact when viewed from above the major surface of the substrate, whereby none of the metal filling each respective via extends outside the contact area of each respective contact.

15 Claims, 6 Drawing Sheets

(51) Int. Cl.
  *H01L 23/00*    (2006.01)
  *H01L 23/31*    (2006.01)
  *H01L 21/78*    (2006.01)
  *H01L 25/065*   (2006.01)
  *H01L 21/56*    (2006.01)

(52) U.S. Cl.
  CPC ............. *H01L 2224/03424* (2013.01); *H01L 2224/03464* (2013.01); *H01L 2224/0401* (2013.01); *H01L 2224/04105* (2013.01); *H01L 2224/05008* (2013.01); *H01L 2224/0508* (2013.01); *H01L 2224/05009* (2013.01); *H01L 2224/05022* (2013.01); *H01L 2224/05027* (2013.01); *H01L 2224/05091* (2013.01); *H01L 2224/05124* (2013.01); *H01L 2224/05139* (2013.01); *H01L 2224/05147* (2013.01); *H01L 2224/05155* (2013.01); *H01L 2224/05548* (2013.01); *H01L 2224/05564* (2013.01); *H01L 2224/05568* (2013.01); *H01L 2224/05611* (2013.01); *H01L 2224/05644* (2013.01); *H01L 2224/131* (2013.01); *H01L 2224/16227* (2013.01); *H01L 2224/32225* (2013.01); *H01L 2224/73253* (2013.01); *H01L 2224/94* (2013.01); *H01L 2924/00014* (2013.01)

(56) References Cited

U.S. PATENT DOCUMENTS

| | | |
|---|---|---|
| 2013/0032944 A1 | 2/2013 | Sato et al. |
| 2013/0040423 A1 | 2/2013 | Tung et al. |
| 2013/0267066 A1* | 10/2013 | Park .................. H01L 24/19 438/121 |
| 2013/0334683 A1 | 12/2013 | Kim et al. |
| 2014/0008809 A1 | 1/2014 | Scanlan |

* cited by examiner

SEMICONDUCTOR DEVICE AND METHOD OF MAKING A SEMICONDUCTOR DEVICE

CROSS-REFERENCE TO RELATED APPLICATIONS

This application claims the priority under 35 U.S.C. § 119 of European Patent application no. 15194136.6, filed on Nov. 11, 2015, the contents of which are incorporated by reference herein.

BACKGROUND

The present specification relates to a semiconductor device and to a method of making a semiconductor device.

Wafer level packages (WLPs) are becoming increasingly important for applications that require a small footprint with improved electrical performance. Wafer level packages are commonly used, for instance, in mobile communications devices such as mobile telephones.

Wafer level packages typically include a substrate having a major surface with one or more electrical contact provided thereon. Solder bumps may be used to mount the package on a surface (such as on a printed circuit board (PCB)) and to form electrical connections to the electrical contact located on the major surface. An encapsulant may be used to provide electrical and mechanical protection for the substrate. The term "wafer level package" derives from the fact that, during manufacture, the solder bumps and encapsulant may be applied to a semiconductor wafer prior to singulation.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor device comprising:

a semiconductor substrate having a major surface;

an encapsulant covering at least the major surface of the substrate;

one or more contacts located on the major surface, wherein a peripheral edge of each contact defines a contact area on the major surface; and one or more bond pads located outside the encapsulant, wherein each bond pad is electrically connected to a respective contact located on the major surface of the substrate by a respective metal filled via that passes through the encapsulant, and wherein a sidewall of each respective metal filled via, at the point at which it meets the respective contact, falls inside the contact area defined by the respective contact when viewed from above the major surface of the substrate, whereby none of the metal filling each respective via extends outside the contact area of each respective contact.

According to another aspect of the present disclosure, there is provided a method of making a semiconductor device, the method comprising:

providing a semiconductor substrate having a major surface;

forming one or more contacts located on the major surface, wherein a peripheral edge of each contact defines a contact area on the major surface;

depositing an encapsulant to cover at least the major surface of the substrate;

forming a via through the encapsulant for each respective contact on the major surface, wherein a sidewall of each via, at the point at which it meets the respective contact, falls inside the contact area defined by the respective contact when viewed from above the major surface of the substrate;

filling each via with metal, wherein none of the metal filling each via extends outside the contact area of each respective contact; and forming one or more bond pads located outside the encapsulant, wherein each bond pad is electrically connected to a respective contact located on the major surface of the substrate by a respective via filled with metal.

The provision of the metal filled vias may avoid the need to attach solder (e.g. solder balls) directly to the contacts on the major surface of the substrate. This may avoid problems relating to solder flakes or excess solder flux contacting the major surface or any sidewalls of the semiconductor substrate directly. The configuration of the metal filled vias themselves, in which their sidewalls fall inside the contact areas defined by the respective contacts they meet, may also prevent the metal used to connect to the contacts on the major surface extending over the edge of those contacts, which may otherwise lead to similar problems such as those described above in relation to the use of solder balls.

The vias may be formed using a laser (e.g. laser drilling). This may allow the location, shape and size of the vias precisely to be controlled.

A surface area of each bond pad may be larger than the contact area of the contact on the major surface of the substrate to which the bond pad is electrically connected. The relatively large area of the bond pads may allow for convenient soldering of the device to a surface, such as the surface of a printed circuit board (PCB).

The encapsulant may have a first outer surface located in a plane parallel to the major surface of the substrate. The one or more bond pads may be located on the first outer surface of the encapsulant. The first outer surface and the bond pads located thereon may allow for convenient surface mounting of the semiconductor device on, for instance, a printed circuit board (PCB).

At least a part of a peripheral edge of at least some of the bond pads may extend to an edge of the first outer surface. This may maximise the surface area of the bond pads without increasing the overall size of the device.

The metal of the metal filled vias may extend at least partially over the first outer surface of the encapsulant. This may allow a good electrical contact to be formed between the bond pad and the metal of the metal filled vias, for example in cases where the bond pad has a larger area than the cross sectional area of the via when viewed from above the major surface of the substrate.

Each bond pad may completely cover an upper surface of the metal of the respective metal filled via electrically connecting the bond pad to the respective contact on the major surface of the substrate.

The substrate may have a backside and a plurality of sidewalls extending between the major surface and the backside.

The encapsulant may cover at least some of the sidewalls of the substrate. The encapsulant may thus provide electrical insulation and mechanical protection for the sidewalls of the substrate. For instance, the encapsulant may prevent any solder flakes or excess solder flux used to attach the bond pads of the device to a printed circuit board (PCB), or other surface, making contact with the sidewalls.

The device may further include a second substrate attached to the backside of the substrate. The second substrate may be a silicon substrate. The second substrate may provide additional mechanical protection for the substrate. The second substrate may also facilitate covering the sidewalls of the substrate with encapsulant during manufacture.

The second substrate may have a major surface and a backside. The major surface of the second substrate may be attached to the backside of the semiconductor substrate. The backside of the second substrate may be provided with a coating.

The semiconductor device may be a wafer level packaged device. A method of making the device may include:

providing a semiconductor wafer having a major surface corresponding to the major surface of the semiconductor substrate;

forming the one or more contacts on the major surface of the wafer;

depositing the encapsulant on the major surface of the wafer;

forming the via(s) and filling each via with metal;

forming the one or more bond pads; and singulating the wafer to produce the semiconductor device.

The method may include attaching the above described second wafer to a backside of the semiconductor wafer prior to singulation. The method may further include sawing through the semiconductor wafer along a plurality of saw lanes after the semiconductor wafer is attached to the second wafer and prior to depositing the encapsulant. In this way, when the encapsulant is deposited, it may fill the saw lanes to cover sidewalls of the semiconductor substrate formed by the sides of each saw lane.

According to another aspect of the present disclosure, there is provided a mobile communications device including a semiconductor device of the kind described above.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
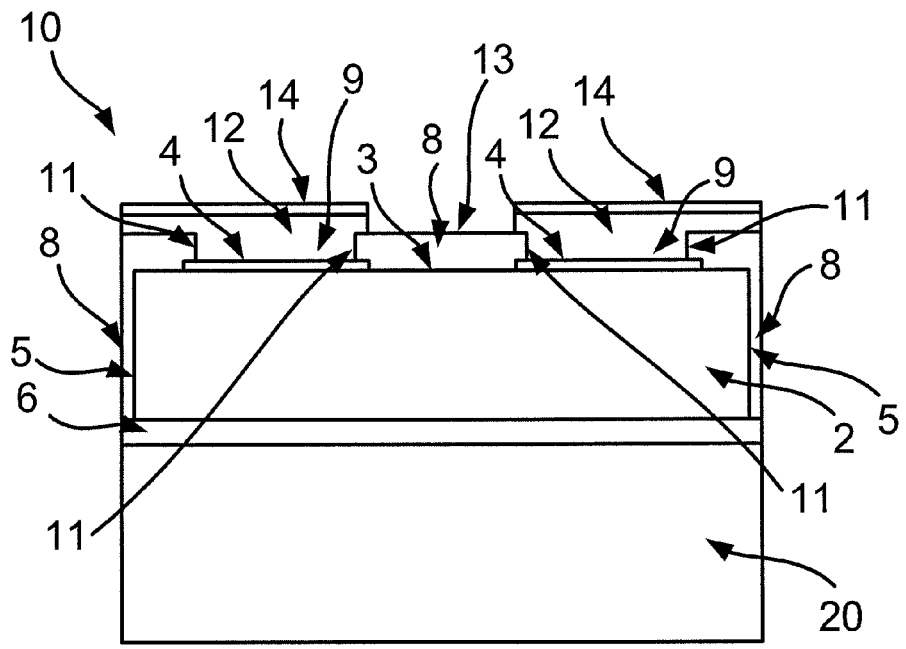
FIG. 1 shows a cross section of a semiconductor device according to an embodiment of this disclosure.
Figure 2:
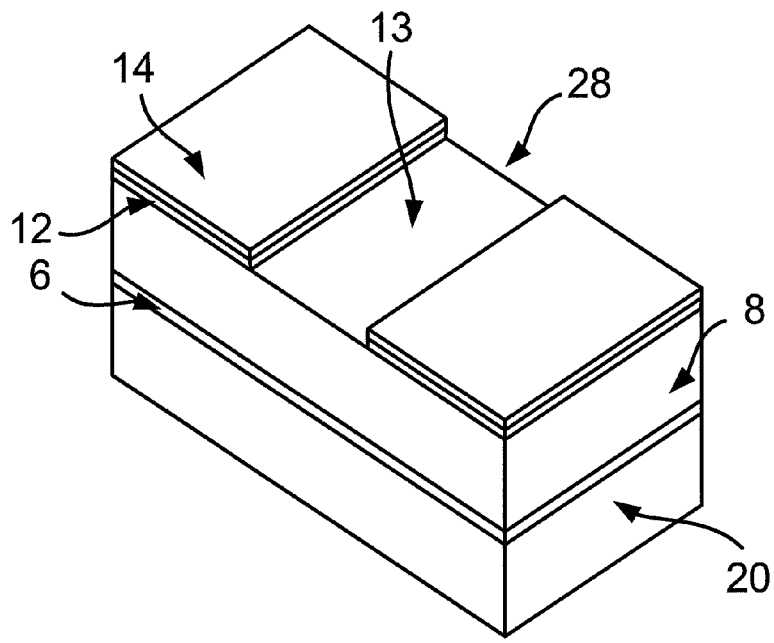
FIG. 2 shows another view of the semiconductor device of FIG. 1.

FIGS. 1 and 2 show an example of a semiconductor device according to a first embodiment of this disclosure. In particular, FIG. 2 shows an external view of the device 10, while FIG. 2 shows a cross-section of the device 10.

The device 10 includes a semiconductor substrate 2 having a major surface 3. The semiconductor substrate 2 may, for example, comprise silicon. The semiconductor substrate 2 may incorporate one or more active components such as transistors or diodes. One or more contacts 4 may be located on the major surface 3 of the semiconductor substrate 2. These contacts 4 may provide electrical connections to the active components within the semiconductor substrate 2. The contacts 4 may comprise a metal such as aluminium, although other metals are envisaged. The contacts 4 may be formed by depositing a patterned metal layer on the major surface 3 of the semiconductor substrate 2.

The device 10 also includes an encapsulant 8, which covers at least the major surface 3 of the semiconductor substrate 2. The encapsulant 8 may comprise any suitable mold compound, such as a compound of the kind that is already used in the field of semiconductor packaging. The encapsulant 8 may provide physical, mechanical and chemical protection for the parts of the device 10 that it encapsulates. In the present example, the encapsulant 8 also covers one or more side walls 5 of the semiconductor substrate 2, which side walls 5 extend between the major surface 3 and a back side of the semiconductor substrate 2.

The contacts 4 on the major surface 3 of the semiconductor substrate 2 each occupy an area on the major surface 3 of the semiconductor substrate 2 that may be referred to hereinafter as a contact area. The contact area associated with each contact 4 on the major surface 3 may be defined by the peripheral edge of that contact 4.

As can be seen more clearly in FIG. 1, the encapsulant 8 includes a number of vias 9, which extend through the encapsulant 8 to meet an upper surface of each respective contact 4 on the major surface 3 of the semiconductor substrate 2. When viewed from above the major surface 3 of the semiconductor substrate 2, the shape of each via 9 may, for example, be circular or oblong (e.g. square). Each via 9 is filled with metal 12. As will be described in more detail below, the metal 12 filling the vias 9 may comprise a stack of metal layers.

The device 10 also includes one or more bond pads 14. The one or more bond pads 14 are each located outside the encapsulant 8. Each bond pad 14 may comprise a layer of metal provided on top of the metal 12 that fills the vias 9. The bond pads 14 may be used to mount the device on a surface such as the surface of a printed circuit board (PCB) using, for example, solder balls. Since the metal 12 filling each via 9 connects each bond pad 14 to a respective contact 4 on the major surface 3 of the semiconductor substrate 2, appropriate electrical connections to the active components within the semiconductor substrate 2 may thereby be provided.

Each via 9 has a side wall 11 that falls within (when viewed from above the major surface 3 of the semiconductor substrate 2) the contact area defined by the contact 4 on the major surface 3 of the substrate that that respective via 9 meets. Since the side wall 11 of each via 9 falls within the contact area defined by its respective contact 4, none of the metal 12 filling each respective via 9 can extend outside the contact area of that respective contact 4.

The arrangement of the contacts 4, metal filled vias 9 and bond pads 14 may allow for secure and effective mounting of the device 10 on the surface of, for example, a printed circuit board (PCB), while avoiding problems relating to the use of solder balls directly on contacts provided on the major surface of a semiconductor substrate. Since the bond pads 14 are located outside the encapsulant 8 and are separated from the contacts 4 on the major surface 3 of the semiconductor substrate 2, the bond pads 14 may allow solder (e.g. solder balls) to be used to mount the device 10 and to make electrical connections to the device 10 in the manner that may, for example, avoid problems relating to solder flakes and excess solder flux making contact with the major surface 3 of the semiconductor substrate 2. Note that in examples in which the encapsulant 8 covers the side walls 5 of the semiconductor substrate 2, this may further prevent any material such as solder or flux coming into contact with the semiconductor substrate 2 itself.

In the present example, a surface area of each bond pad 14 is larger than the contact area of the contact 4 on the major surface 3 of the semiconductor substrate 2 to which that bond pad 14 is electrically connected by a respective metal filled via 9. For instance, at least a part of a peripheral edge of at least some of the bond pads 14 may extend to an edge of a first outer surface 13 of the encapsulant 8. The first outer surface 13 of the encapsulant 8 may be a surface that is parallel to a plane containing the major surface 3 of the semiconductor substrate 2.

Accordingly, because the area of each bond pad 14 may be larger than the contact area of its associated contact 4, effective electrical connections may be made to each contact 4 while presenting a larger surface area for the attachment of the solder (e.g. a solder ball). This may make mounting of the device 10 on a surface such as the surface of a printed circuit board (PCB) easier.

As noted previously, the metal 12 filling each via 9 may be provided in the form of a stack of metal layers. Table 1 below shows a number of alternative example configurations (labelled A through G) for the material of the contacts 4, the stack of metal layers forming the metal 12 filling the vias 9, and the bond pads 14.

device 10 and may also protect the back side of the semiconductor substrate 2. Note that the encapsulant 8 and second substrate 20 in the present example may completely enclose the semiconductor substrate 2 from the surrounding environment.

Figure 3:
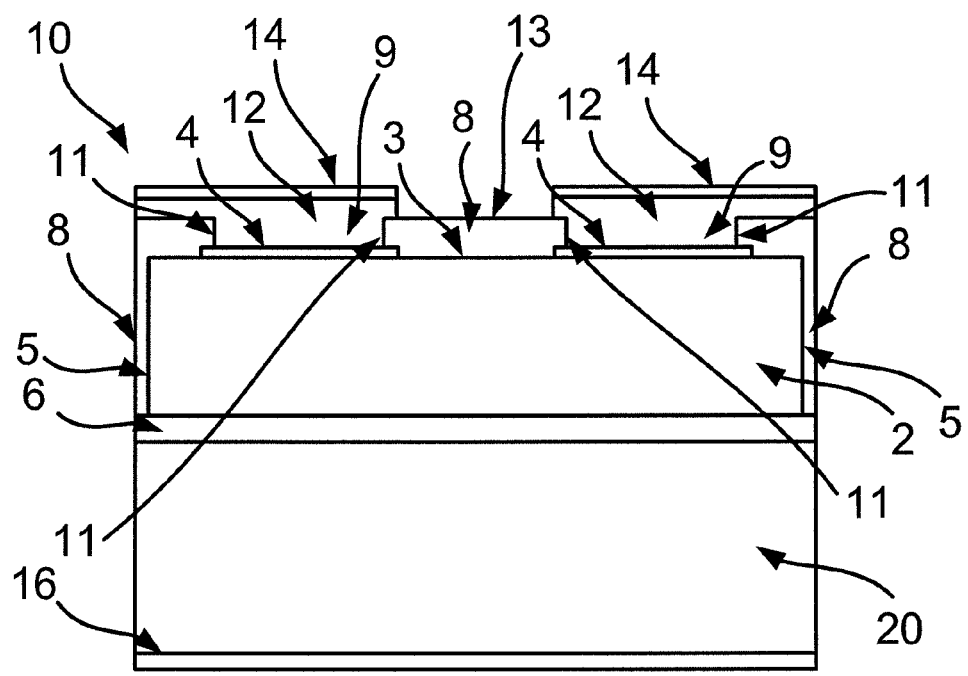
FIG. 3 shows a cross section of a semiconductor device according to another embodiment of this disclosure.
Figure 4:
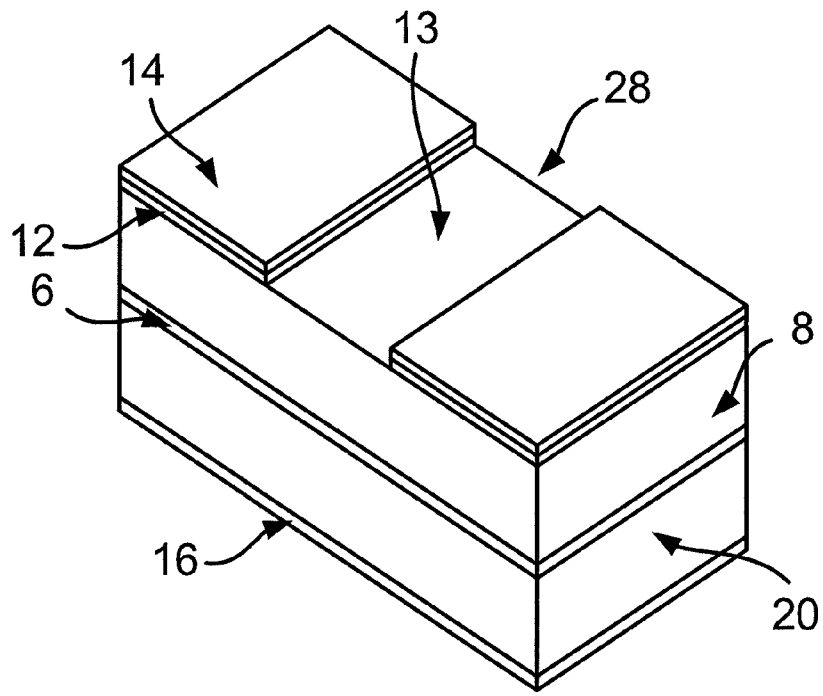
FIG. 4 shows another view of the semiconductor device of FIG. 3.

FIGS. 3 and 4 show a semiconductor device 10 according to another embodiment of the present disclosure. The example shown in FIGS. 3 and 4 is similar in many respects to the example described above in relation to FIGS. 1 and 2. However, in the example of FIGS. 3 and 4 the device 10 is further provided with a coating 16, which may provide mechanical and chemical protection for the back of the device 10 and which may block out light. The coating 16 may comprise a plastic tape. The second substrate 20 may have a major surface which may be attached to the back side of the semiconductor substrate 2 using the adhesive 6. The coating 16 may be located on a back side of the second substrate 20, which may be a surface opposite the major surface of the second substrate 20. Where the device 10 does not include a second substrate 20, the coating 16 may be provided instead on the backside of the substrate 2.

The devices described above in relation to FIGS. 1-4 may be relatively compact and accordingly may be particularly suitable for use in applications that require a small footprint and/or volume. The devices may comprise wafer level packages, and examples methods for making such devices is described below. In accordance with embodiments of this disclosure, a device of the kind described herein may, for example, be provided in a mobile communications device such as a mobile telephone, laptop, watch or tablet.

TABLE 1

Example Metal Layer Configurations

| | A | B | C | D | E | F | G |
|---|---|---|---|---|---|---|---|
| Contacts 4 | Al alloy, Ag alloy, or Tn alloy | Al alloy, Ag alloy, or Tn alloy | Al alloy, Ag alloy, or Tn alloy | Al alloy, Ag alloy, or Tn alloy | Al alloy, Ag alloy, or Tn alloy | Al alloy, Ag alloy, or Tn alloy | Al alloy, Ag alloy, or Tn alloy |
| Layers in stack forming metal 12 (listed from lowermost layer to upper most layer) | Copper, Nickel, Copper | Copper, Nickel, Copper | Copper, Ag Paste, Nickel | Copper, Ag Paste, Copper | Ag Paste, Nickel | Ag Paste, Nickel | Copper |
| Bond Pads 14 | Tin | ENiG | Tin | ENiG | ENiG | Tin | Tin |

As can be seen in FIG. 1 in particular, in the present example, the metal 12 filing each via 9 may extend at least partially over the first outer surface 13 of the encapsulant 8. Accordingly, not all of the metal 12 filling each via 9 is necessarily located inside the via 9 itself. In this example, some of the metal 12 may extend outside the via 9 in order to implement a good electrical connection between the metal 12 and its respective bond pad 14, particularly in examples in which the area of each bond 14 pad is greater than the area defined by the side wall 11 of each respective via 9 and/or the contact area of each respective contact 4. For instance, each bond pad 14 may completely cover an upper surface of the metal 12 of the metal filled via 9.

As can be seen from FIGS. 1 and 2, in the present example the device 10 further includes a second substrate 20. The second substrate 20 may, for example, also be a semiconductor substrate such as a silicon substrate. The second substrate 20 may be attached to a back side of the semiconductor substrate 2 using an adhesive 6. The second substrate 20 may provide additional mechanical strength for the FIGS. 5-13 show the various stages in a method of making a semiconductor device in accordance with an embodiment of this disclosure.

Figure 5:
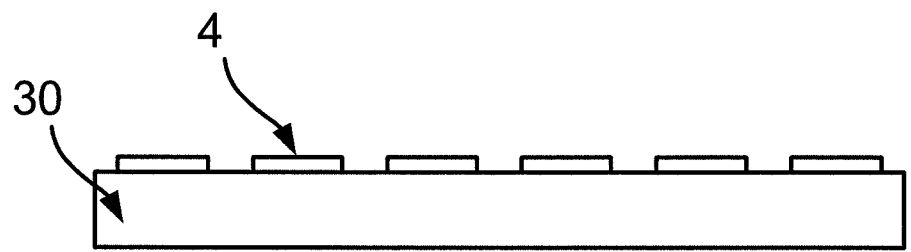
FIGS. 5 to 13 illustrate a method of making a semiconductor device according to an embodiment of this disclosure.

In FIG. 5 there is provided a semiconductor wafer 30. The wafer 30 may be a silicon wafer. As will be described below, the wafer 30 will subsequently be singulated to form a plurality of semiconductor devices of the kind described above. The wafer 30 has major surface that corresponds to the major surface 3 of the semiconductor substrates 2 described above in relation to FIGS. 1-4. A patterned metal layer may be deposited onto the major surface of the wafer 3 to form a plurality of contacts 4, which also correspond to the contacts 4 described above in relation to FIGS. 1-4.

Figure 6:
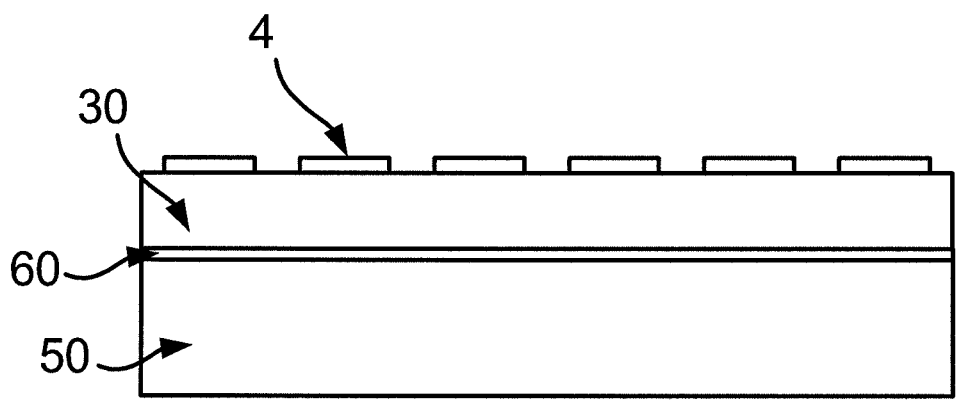
Figure 7:
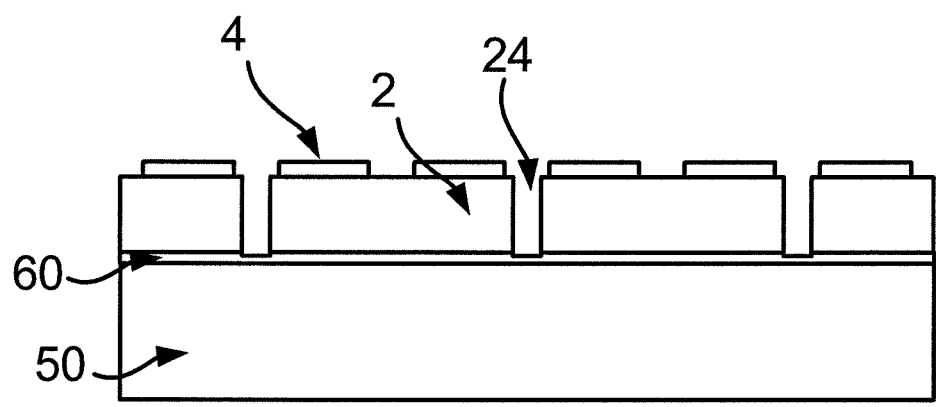

As shown in FIG. 6, in this example a second wafer 50 (which, after singulation, will correspond to the second substrate 20 described above in relation to FIGS. 1-4) may be attached to a back side of the wafer 30 using an adhesive 60. In addition to providing mechanical, electrical and chemical protection for the back side of the semiconductor substrate 2 described above, the wafer 50 may act as a carrier for the semiconductor wafer 30 during manufacture. An example of this can be seen in FIG. 7. In FIG. 7, the wafer 30 is sawn in a number of locations defined by saw lanes 24. This singulates the wafer 30 to produce a plurality of semiconductor substrates 2 of the kind described above. Note that the saw lanes 24 extend completely through the wafer 30 in order effectively to singulate the substrates 2, but do not also singulate the underlying second substrate 50. In the example of FIG. 7, the saw lanes 24 do not extend at all into the second wafer 50, although it is envisaged that in other examples the saw lanes 24 may extend at least partially down into the second wafer 50, so that an encapsulant, which is to be deposited subsequently, may cover at least a part of some of the side walls of the second substrate 20 described above in relation to FIGS. 1-4. Note that after singulation of the substrates 2 as shown in FIG. 7, the second wafer 50 carries each semiconductor substrate 2 to which it is adhered by the adhesive 60, so that further steps of the kind described below may be implemented.

Figure 8:
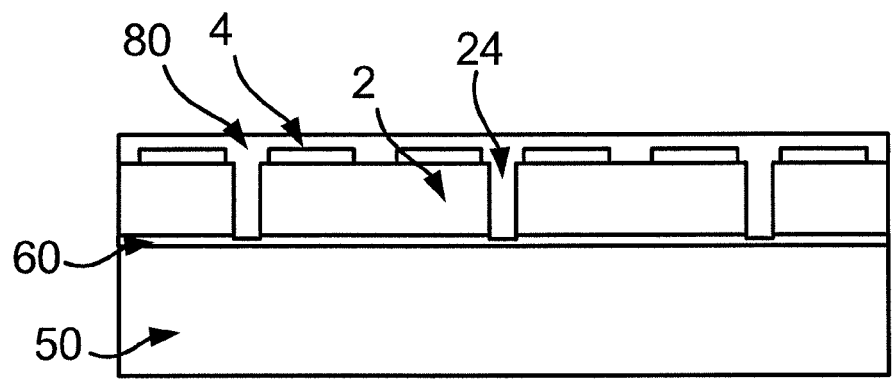

In a next step shown in FIG. 8, an encapsulant 80 is deposited over the major surface of the wafer 30 comprising the singulated substrates 2. The encapsulant 80 covers the major surface 3 of each singulated semiconductor substrate 2 and also may fill the saw lanes 24. Note that the encapsulant 80 filling the saw lanes 24 may subsequently foul' the part of the encapsulant 8 that covers the side walls 5 of each semiconductor substrate 2 of the kind described above.

Figure 9:
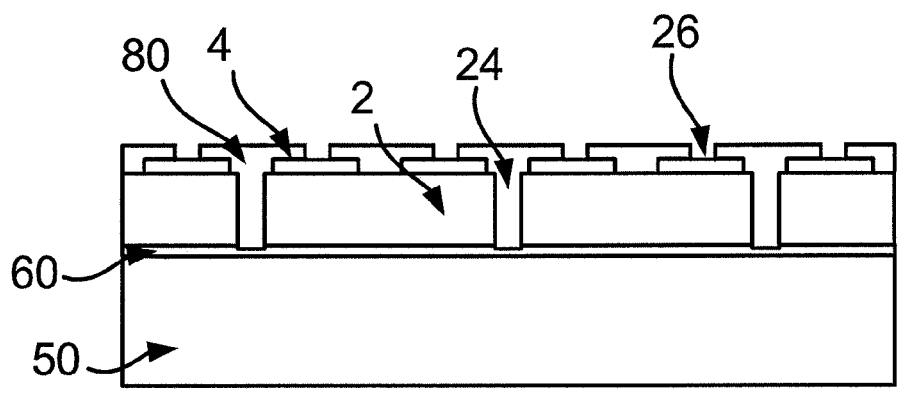

In a next step shown in FIG. 9, a number of vias 26 may be formed through the encapsulant 80. As can be seen in FIG. 9, each via 26 may extend through a portion of the encapsulant 80 located substantially above each contact 4. The vias 26 may, for example, be formed using a laser, whereby the location, size and shape of each via 26 may be precisely controlled. As previously noted, the vias 26 may, for instance, be circular or oblong in cross section.

Figure 10:
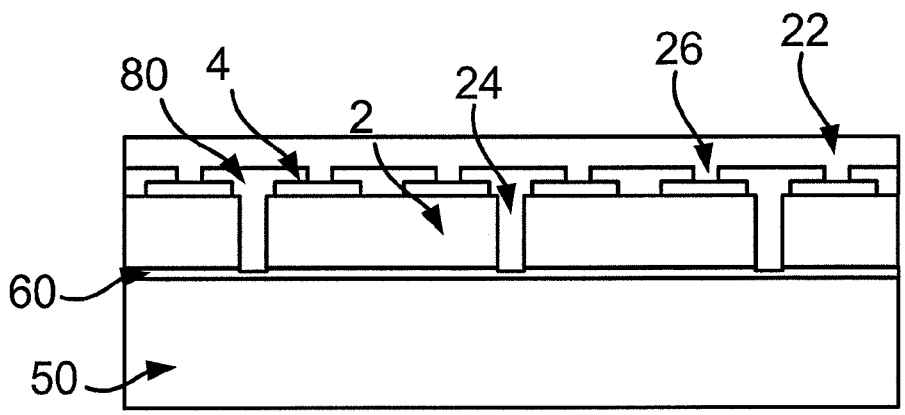

In a next step shown in FIG. 10, each via 26 may be filled with metal 22. The metal 22 may be deposited as a stack of metal layers as described above in relation to Table 1.

Figure 11:
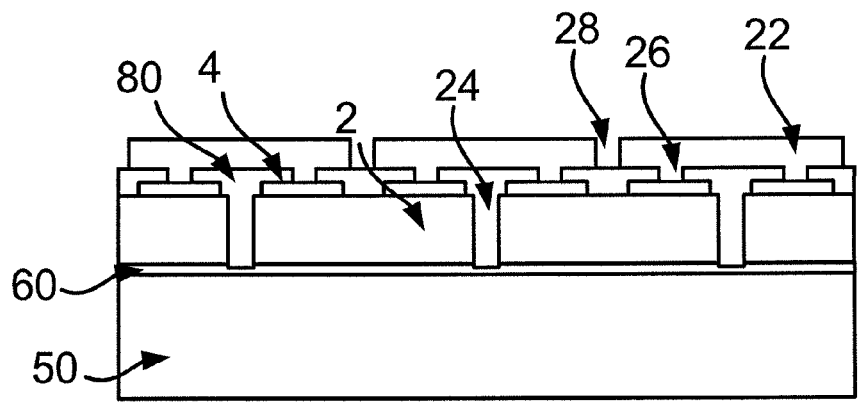

In a next step shown in FIG. 11, the metal 22 may be patterned to produce a number of separate metal portions separated by gaps 28. These gaps 28 will, after singulation, correspond to the gaps 28 shown in FIGS. 2 and 4 of the examples described above.

Figure 12:
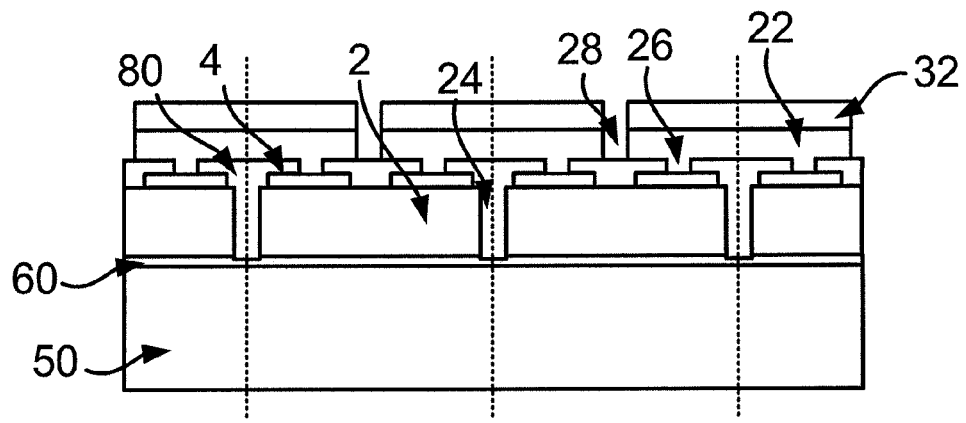

In a next step shown in FIG. 12, the metal 22 may be covered with a further metal layer 32 that, after singulation, will form the bond pads 14 of the kind described above in relation to FIGS. 1-4.

Figure 13:
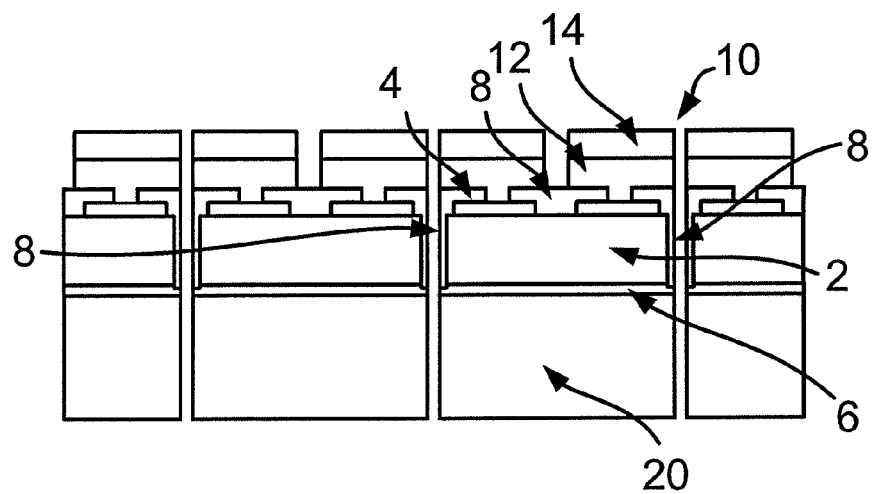

In a next step shown in FIG. 13, the wafer may be singulated along the dotted lines shown in FIG. 12, to produce a plurality of semiconductor devices 10 of the kind shown in FIGS. 1 and 2. Note that the saw lanes used to singulate the wafer may be thinner than the saw lanes 24 described above in relation to FIG. 7 and may thus be sufficiently thin such that at least a part of the encapsulant 80 remains on the side walls of each semiconductor substrate 2, as already described in relation to FIG. 1 and FIG. 2.

Figure 14:
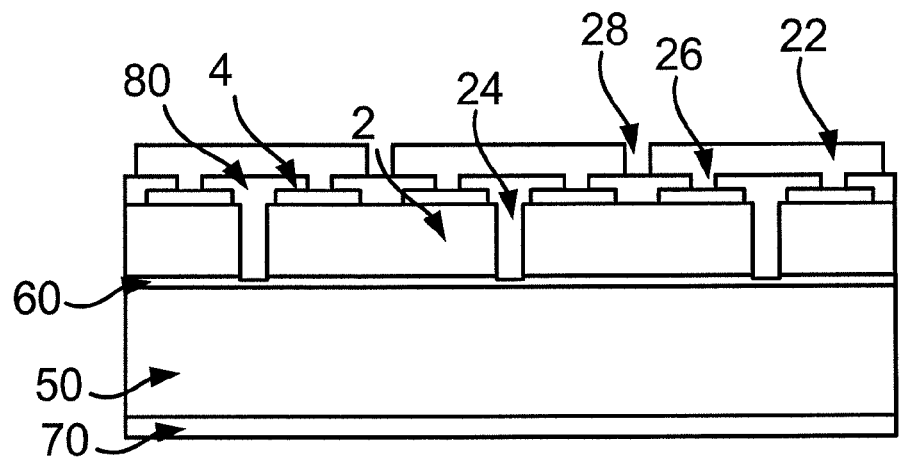
FIGS. 14 to 16 illustrate a method of making a semiconductor device according to another embodiment of this disclosure.
Figure 15:
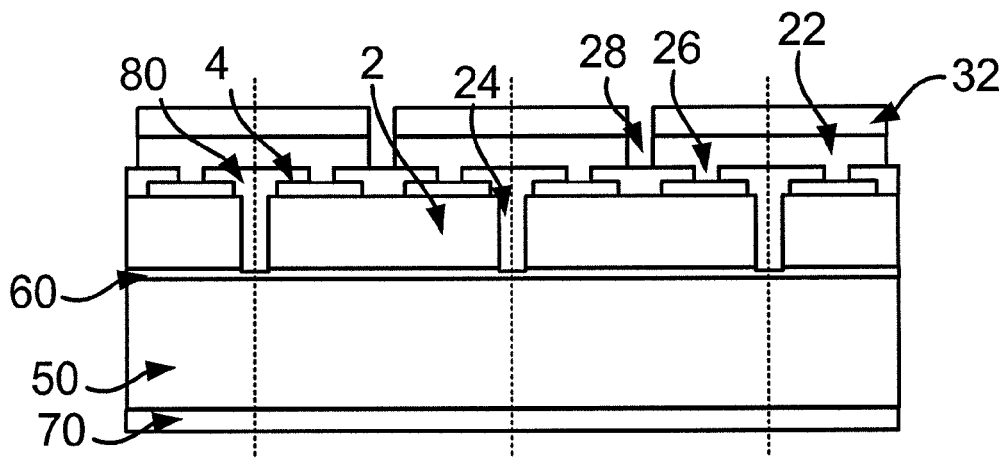
Figure 16:
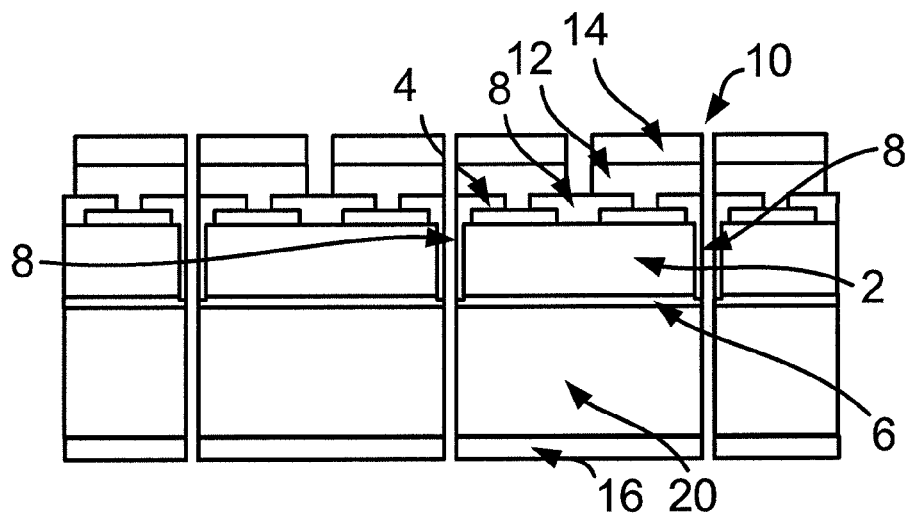

FIGS. 14-16 show an alternative sequence of manufacturing steps to those described above in relation to FIGS. 11-13. The sequence shown in FIGS. 14-16 is substantially the same as the sequence shown in FIGS. 11-13, except that a coating 70 is provided on the back side of the second wafer 50. As can be seen in FIG. 16, after singulation, the coating 70 forms a coating 16 on the back side of each second substrate 20 of each singulated semiconductor device 10. The coating 16 may be a coating of the kind already described above in relation to FIGS. 3 and 4.

Accordingly, there has been described a semiconductor device and a method of making the same. The device includes a semiconductor substrate having a major surface, one or more contacts located on the major surface and an encapsulant covering at least the major surface. A peripheral edge of each contact defines a contact area on the major surface. The device also includes one or more bond pads located outside the encapsulant. Each bond pad is electrically connected to a respective contact located on the major surface of the substrate by a respective metal filled via that passes through the encapsulant. A sidewall of each respective metal filled via, at the point at which it meets the respective contact, falls inside the contact area defined by the respective contact when viewed from above the major surface of the substrate, whereby none of the metal filling each respective via extends outside the contact area of each respective contact.

Although particular embodiments of this disclosure have been described, it will be appreciated that many modifications/additions and/or substitutions may be made within the scope of the claims.

The invention claimed is:

1. A semiconductor device comprising:
a semiconductor substrate having a major surface;
an encapsulant covering at least the major surface of the substrate;
one or more contacts located on the major surface, wherein a peripheral edge of each contact defines a contact area on the major surface; and
one or more bond pads located outside the encapsulant, wherein each bond pad is electrically connected to a respective contact located on the major surface of the substrate by a respective metal filled via that passes through the encapsulant, wherein each bond pad comprises a separate layer of metal on an upper surface of the respective metal that fills the via, and
wherein each respective metal filled via has a sidewall, at the point at which it meets the respective contact, that falls inside the contact area defined by the respective contact when viewed from above the major surface of the substrate, whereby none of the metal filling each respective via extends outside the contact area of each respective contact.

2. The semiconductor device of claim 1, wherein each bond pad has a surface area that is larger than the contact area of the contact on the major surface of the substrate to which the bond pad is electrically connected.

3. The semiconductor device of claim 1, wherein the encapsulant has a first outer surface located in a plane parallel to the major surface of the substrate, wherein the one or more bond pads are located on the first outer surface of the encapsulant.

4. The semiconductor device of claim 3, wherein at least a part of a peripheral edge of one or more of the bond pads extends to an edge of the first outer surface.

5. The semiconductor device of claim 3, wherein the metal of the metal filled vias extends at least partially over the first outer surface of the encapsulant.

6. The semiconductor device of claim 1, wherein each bond pad completely covers the upper surface of the metal of the respective metal filled via electrically connecting the bond pad to the respective contact on the major surface of the substrate.

7. The semiconductor device of claim 1, wherein the substrate has a backside and a plurality of sidewalls extending between the major surface and the backside, and wherein the encapsulant covers at least some of the sidewalls of the substrate.

8. The semiconductor device of claim 1, wherein the substrate has a backside and a plurality of sidewalls extending between the major surface and the backside, and wherein the semiconductor device further comprises a second substrate attached to the backside of the substrate.

9. The semiconductor device of claim 8, wherein the second substrate has a major surface and a backside, wherein the major surface of the second substrate is attached to the backside of the substrate, and wherein the backside of the second substrate is provided with a coating.

10. A mobile communications device comprising the semiconductor device of claim 1.

11. A method of making a semiconductor device, the method comprising:
providing a semiconductor substrate having a major surface;
forming one or more contacts located on the major surface, wherein a peripheral edge of each contact defines a contact area on the major surface;
depositing an encapsulant to cover at least the major surface of the substrate;
forming a via through the encapsulant for each respective contact on the major surface, wherein a sidewall of each via, at the point at which it meets the respective contact, falls inside the contact area defined by the respective contact when viewed from above the major surface of the substrate;
filling each via with metal, wherein none of the metal filling each via extends outside the contact area of each respective contact; and
forming one or more bond pads located outside the encapsulant, wherein each bond pad is electrically connected to a respective contact located on the major surface of the substrate by a respective via filled with metal, wherein each bond pad comprises a separate layer of metal on an upper surface of the respective metal that fills the via.

12. The method of claim 11, comprising using a laser o each respective via.

13. The method of claim 11 comprising:
providing a semiconductor wafer having a major surface corresponding to the major surface of said semiconductor substrate;
forming said one or more contacts on the major surface of the wafer;
depositing the encapsulant on the major surface of the wafer;
forming each via and filling each via with the metal;
forming said one or more of the bond pads; and
singulating the wafer to produce said semiconductor device.

14. The method of claim 13, further comprising attaching a second wafer to a backside of the semiconductor wafer prior to said singulation.

15. The method of claim 14, comprising sawing through the semiconductor wafer along a plurality of saw lanes after said semiconductor wafer is attached to the second wafer and prior to depositing the encapsulant, whereby the encapsulant fills the saw lanes to cover sidewalls of the semiconductor substrate formed by the sides of each saw lane.

* * * * *